US012638496B1

(12) United States Patent
Jafri et al.

(10) Patent No.: US 12,638,496 B1
(45) Date of Patent: May 26, 2026

(54) ELECTRONICS PART VERIFICATION SYSTEM

(71) Applicant: Streamline Electronics Manufacturing, Inc., Fremont, CA (US)

(72) Inventors: Shahab Jafri, Fremont, CA (US); Kazim Jafri, Fremont, CA (US)

( * ) Notice: Subject to any disclaimer, the term of this patent is extended or adjusted under 35 U.S.C. 154(b) by 0 days.

(21) Appl. No.: 19/038,751

(22) Filed: Jan. 28, 2025

Related U.S. Application Data

(60) Provisional application No. 63/723,615, filed on Nov. 22, 2024.

(51) Int. Cl.
*G01R 31/28* (2006.01)

(52) U.S. Cl.
CPC ..... *G01R 31/2837* (2013.01); *G01R 31/2834* (2013.01); *G01R 31/2844* (2013.01)

(58) Field of Classification Search
CPC ............ G01R 31/2837; G01R 31/2834; G01R 31/2844
USPC .. 324/654, 658, 691, 750.15, 750.2, 756.01, 324/756.07, 757.01, 762.01
See application file for complete search history.

(56) References Cited

U.S. PATENT DOCUMENTS

| | | | | | |
|---|---|---|---|---|---|
| 4,748,401 | A | * | 5/1988 | Aldinger ............. | G01R 31/016 324/548 |
| 5,504,422 | A | * | 4/1996 | Bundschuh .......... | G01R 31/016 324/133 |
| 6,311,301 | B1 | * | 10/2001 | Posse ................. | G01R 31/2801 714/724 |
| 8,821,012 | B2 | * | 9/2014 | Wang .................... | G01K 7/015 374/170 |
| 9,024,651 | B2 | * | 5/2015 | Root .................. | G01R 31/2889 324/750.08 |
| 11,221,360 | B1 | * | 1/2022 | Thiel .................. | G01R 31/2812 |
| 2004/0044973 | A1 | * | 3/2004 | Parker ................ | G01R 31/2834 716/112 |
| 2020/0103460 | A1 | * | 4/2020 | Obidat ............... | G01R 31/2889 |
| 2021/0341547 | A1 | * | 11/2021 | Bagga .................... | G01R 31/52 |

FOREIGN PATENT DOCUMENTS

CN          110921317 A  *  3/2020

* cited by examiner

*Primary Examiner* — Arleen M Vazquez
*Assistant Examiner* — Robert P Alejnikov, Jr.
(74) *Attorney, Agent, or Firm* — Shapiro IP Law; Joseph Shapiro

(57) ABSTRACT
An electronics part verification system may comprise a test-site board loaded onto or otherwise secured to a PnP machine and computer instructions for using the PnP machine's capabilities to (i) retrieve a component-to-be-verified from a feeder; (2) move the component to a test site on the test-site board; (3) use an LCR meter to obtain an inductance, capacitance, or resistance value for the component; and (4) determine, based on the value from the LCR meter, whether the component is correct or incorrect.

20 Claims, 17 Drawing Sheets

200

290

210b

280

1400

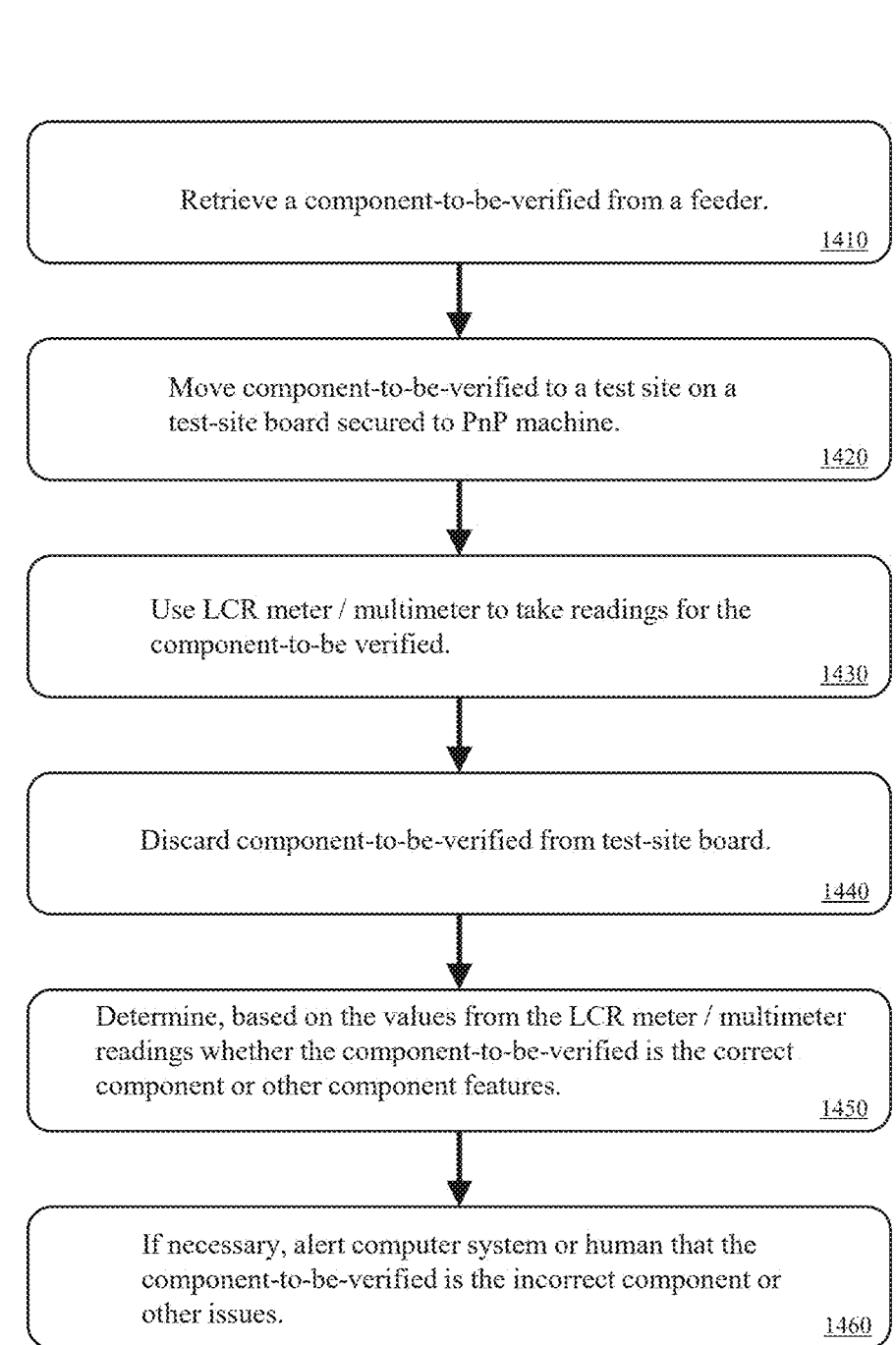

Retrieve a component-to-be-verified from a feeder.

1410

Move component-to-be-verified to a test site on a test-site board secured to PnP machine.

1420

Use LCR meter / multimeter to take readings for the component-to-be verified.

1430

Discard component-to-be-verified from test-site board.

1440

Determine, based on the values from the LCR meter / multimeter readings whether the component-to-be-verified is the correct component or other component features.

1450

If necessary, alert computer system or human that the component-to-be-verified is the incorrect component or other issues.

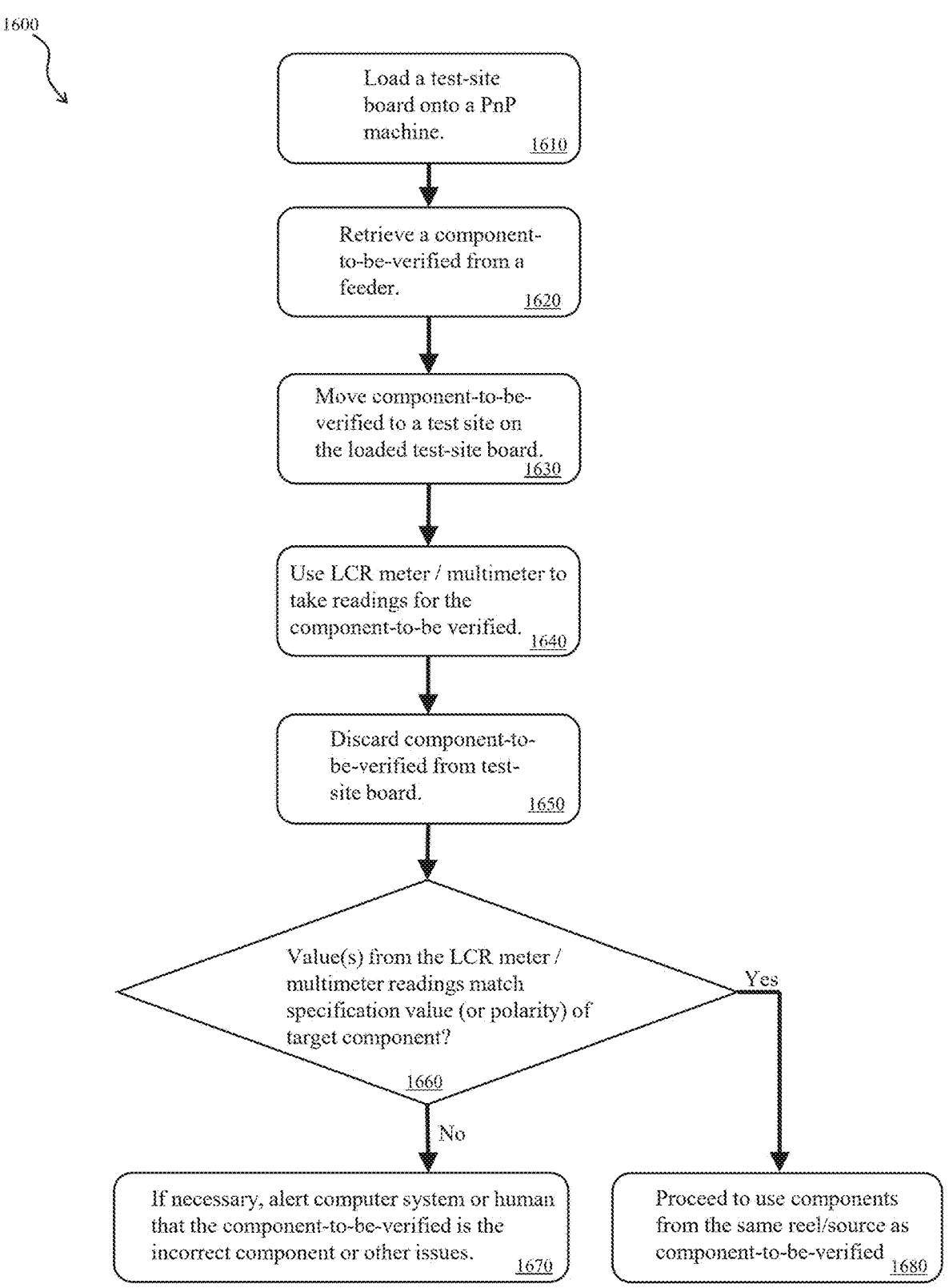

1600

Load a test-site
board onto a PnP
machine.          1610

Retrieve a component-
to-be-verified from a
feeder.          1620

Move component-to-be-
verified to a test site on
the loaded test-site board.          1630

Use LCR meter / multimeter to
take readings for the
component-to-be verified.          1640

Discard component-to-
be-verified from test-
site board.          1650

Value(s) from the LCR meter /
multimeter readings match
specification value (or polarity) of
target component?

1660

Yes

No

If necessary, alert computer system or human
that the component-to-be-verified is the
incorrect component or other issues.          1670

Proceed to use components
from the same reel/source as
component-to-be-verified          1680

FIG. 16

1700

Retrieve a component-
to-be-verified from a
feeder.                    1710

↓

Move component-to-be-
verified to a test site on a
test-site board secured to
PnP machine.              1720

↓

Use LCR meter / multimeter to
take readings for the
component-to-be verified. 1730

↓

Discard component-to-
be-verified from test-
site board.               1740

↓

Value(s) from the LCR meter /
multimeter readings match
specification value (or polarity) of
target component?

1750                                      Yes

No

If necessary, alert computer system or human
that the component-to-be-verified is the
incorrect component or other issues.
                                          1760

Proceed to use components
from the same reel/source as
component-to-be-verified   1770

FIG. 17

ELECTRONICS PART VERIFICATION SYSTEM

BACKGROUND OF THE INVENTION

Electronics manufacturing/fabrication frequently requires attaching very small components/parts to printed circuit boards (PCBs). The components attached to PCBs can be classified as either passive or active. In general, a passive component/part has two terminals (electrical connections/outputs/inputs) and an active component/part has more than two terminals (electrical connections/outputs/inputs). Passive components include, e.g., resistors, capacitors, inductors, diodes, LEDs, etc. Passive components vary widely in size, ranging from very small (e.g., 10 mil×5 mil) to relatively large (e.g., 0.5+ inches×0.75+ inches).

A typical manufacturing job may comprise placing anywhere from one or two up to 100+ different component types at anywhere from a few up to 10,000+ different locations on a PCB. These figures may vary depending on the precise characteristics/parameters of a specific job.

In a conventional manufacturing setup, a PnP ("Pick and Place") machine (which conventionally includes a vacuum nozzle for pickup, raising/lowering, moving, and placing components) picks up a component from a feeder and then places it at a predefined (according to a program loading into the PnP software) location on the board/PCB. A PnP machine may also be known as an SMT ("Surface Mount Technology") PnP machine. Each feeder corresponds to one specific component type. A reel of components (often a tape comprising uniformly spaced components along the tape, which is rolled up to form the reel) is loaded into a feeder. Sometimes, if a reel is not available, a strip of parts may be used. A strip is a small part of a reel and holds a smaller number of components. A conventional setup will often comprise a loaded feeder (loaded with a reel or strip) for each different component type. A conventional PnP machine can hold up to 128 8 mm-wide feeders. Variations on this conventional setup do exist, e.g., wider feeders (that may occupy more than one feeder slot) for larger parts and varying feeder capacity for PnP machines.

One of the issues that arises in this process/setup is component verification. If even one feeder is loaded with the incorrect reel or strip (of components), the resulting board will have to be reworked or discarded because incorrect components will be installed and the board will not function as designed. Because the components are so small and often look identical to the naked eye, visual component verification, i.e., by looking for markings on individual components, is very difficult (in some cases impossible), time-consuming, and risky because a single human error could ruin an entire board.

Another component verification method is to manually measure the electrical characteristics of a sample component from each reel or strip to verify that the correct reel or strip has been loaded into the correct feeder. This is usually done with an LCR (inductance (L), capacitance (C), and resistance (R)) meter or a multimeter. For manual verification using an LCR meter/multimeter, a human takes a sample (sacrificial, because the component cannot be returned to the reel or strip for use) component from a reel or strip and uses the LCR meter/multimeter to touch the two terminals on the component and verify that the reading (inductance, capacitance, or resistance-depending on the component in question) has the correct value according to the program and board design specifications. Once these values are specified, the reel or strip is loaded into the appropriate feeder.

Measurements other than LCR measurements may be taken for component verification. For example, for diodes and LEDs, polarity (for correct orientation) may be tested-instead of inductance, capacitance, or resistance. A multimeter (or tool with similar functionality) is used to verify the polarity of a diode or LED; strict LCR meters cannot verify the polarity of a diode or the LED. A multimeter can be used to verify the polarity of the diodes, LEDs and measurement of resistance, capacitance, or inductance of passive components as required.

Although manual component verification is generally effective, it does suffer from several shortcomings and risks. First, it can be time consuming for a human to manually verify component values. Second, human error could result in an incorrect reel or strip being loaded into a feeder notwithstanding efforts to manually verify. One type of human error is misreading units, i.e., the LCR meter/multimeter could show the correct number but incorrect unit (e.g., off by orders of decimal/magnitude) and the human performing manual verification may see the correct number but not catch that the units are incorrect. Third, all-passive components have varying tolerances. The LCR meter/multimeter reads only the measured value, and so determining whether or not the measured value is within the given tolerance range of a desired part is difficult and error-prone, especially because human operators are the ones comparing and verifying. This may result in a human erroneously determining that an incorrect component is a correct component or, vice versa, that a correct component is an incorrect component.

Another component verification solution is offered by OEMs (Original Equipment Manufacturers) of the PnP machines: a mechanical automated verification system that tests/checks components after a reel or strip has been loaded into a feeder on the PnP machine. Such systems often use the PnP's machine's vacuum nozzle to pick up one sample/sacrificial component from each reel or strip (already loaded into a feeder) and then use an integrated LCR meter/multimeter to measure LCR values for the component. In this case, the integrated LCR meter/multimeter is a fixed mechanical jig where a part is dropped into a drop-off zone, and two large metal blocks (one per terminal of the part) are mechanically and automatically pushed/moved in from the sides to contact the two ends of the component to conduct a measurement. The part is then picked up by the nozzle and disposed of, often by dropping/placing the component in a discard bin.

Currently available automated component verification systems suffer from significant shortcomings, including at least: (1) Cost—$20 k-25 k per machine. A small company with 5-10 machines would need an LCR checker for each machine, totally $200 k-$250 k for 10 machines. This is a significant expense; and (2) Each OEM has designed its LCR automated testing solution to be specific to that OEM's PnP machines but not universal-so that one OEM's LCR automated testing solution is not compatible with PnP machines from another OEM/manufacturer. Some OEMs do not offer an LCR solution and OEMs that offer an automated component verification solution do not offer retrofit on older models or earlier software versions. In these cases the only possibility is to replace the PnP machine, which can cost upwards of hundreds of thousands of dollars each.

Because of the significant cost of automated component verification systems for PnP machines, many companies choose to not purchase an OEM automated solution and instead opt to do component verification manually only.

What is needed is an automated LCR/multimeter passive component verification system having improved characteristics in accuracy, cost, and/or retrofitting.

BRIEF SUMMARY OF THE INVENTION

An electronics part verification system may comprise a test-site board loaded onto or otherwise secured to a PnP machine and computer instructions for using the PnP machine's capabilities to (i) retrieve a component-to-be-verified from a feeder; (2) move the component to a test site on the test-site board; (3) use an LCR meter to obtain an inductance, capacitance, or resistance value for the component; and (4) determine, based on the value from the LCR meter, whether the component is correct or incorrect.

BRIEF DESCRIPTION OF THE DRAWINGS

FIG. 14 shows a flowchart for an exemplary method for component verification as described herein.

FIG. 16 shows a flowchart for an exemplary method for component verification as described herein.

FIG. 17 shows a flowchart for an exemplary method for component verification as described herein.

DETAILED DESCRIPTION OF THE INVENTION

Figure 1:
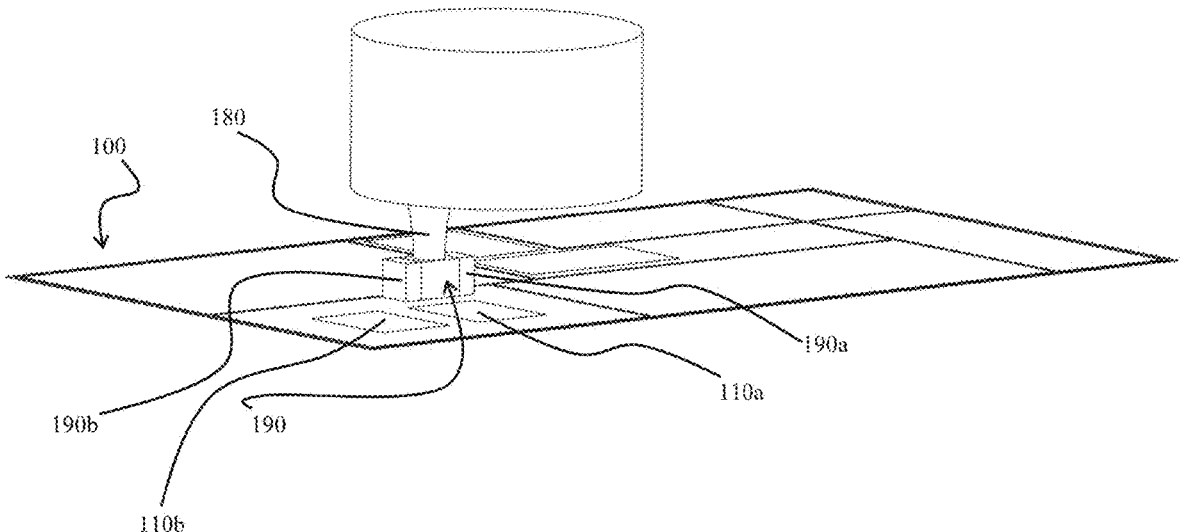
FIG. 1 shows a slightly elevated angle view of an exemplary test-site board as described herein having one test site, and additionally showing a PnP vacuum nozzle holding a component above the test site.
Figure 2:
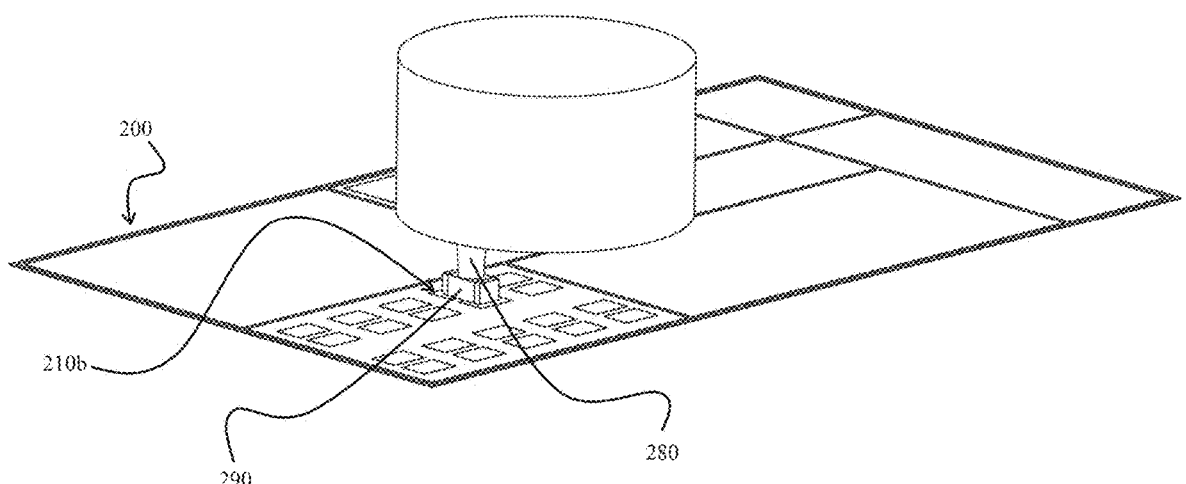
FIG. 2 shows an elevated angle view of an exemplary test-site board as described herein having ten test sites, and additionally showing a PnP vacuum nozzle holding a component that is touching a test site.
Figure 3:
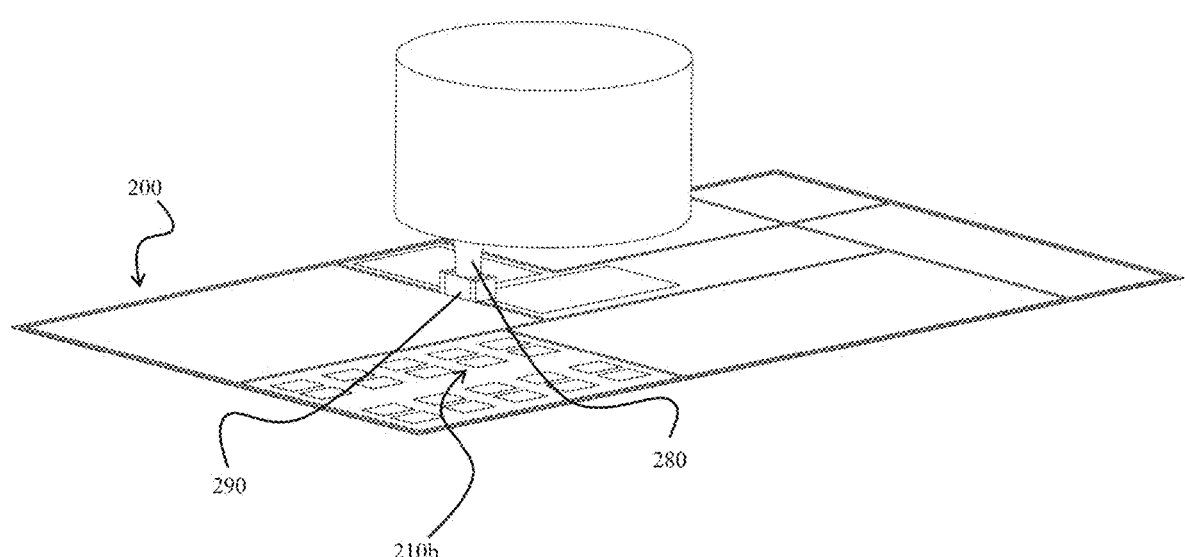
FIG. 3 shows an elevated angle view of an exemplary test-site board as described herein having ten test sites, and additionally showing a PnP vacuum nozzle holding a component above a test site.
Figure 4:
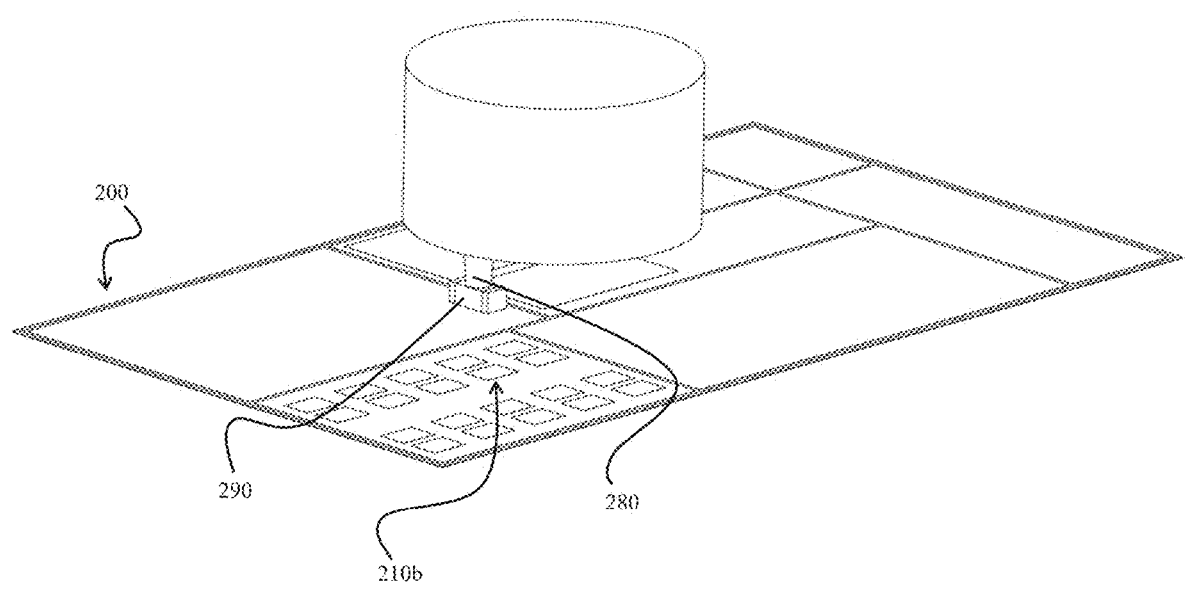
FIG. 4 shows an elevated angle view of an exemplary test-site board as described herein having ten test sites, and additionally showing a PnP vacuum nozzle holding a component above a test site.
Figure 5:
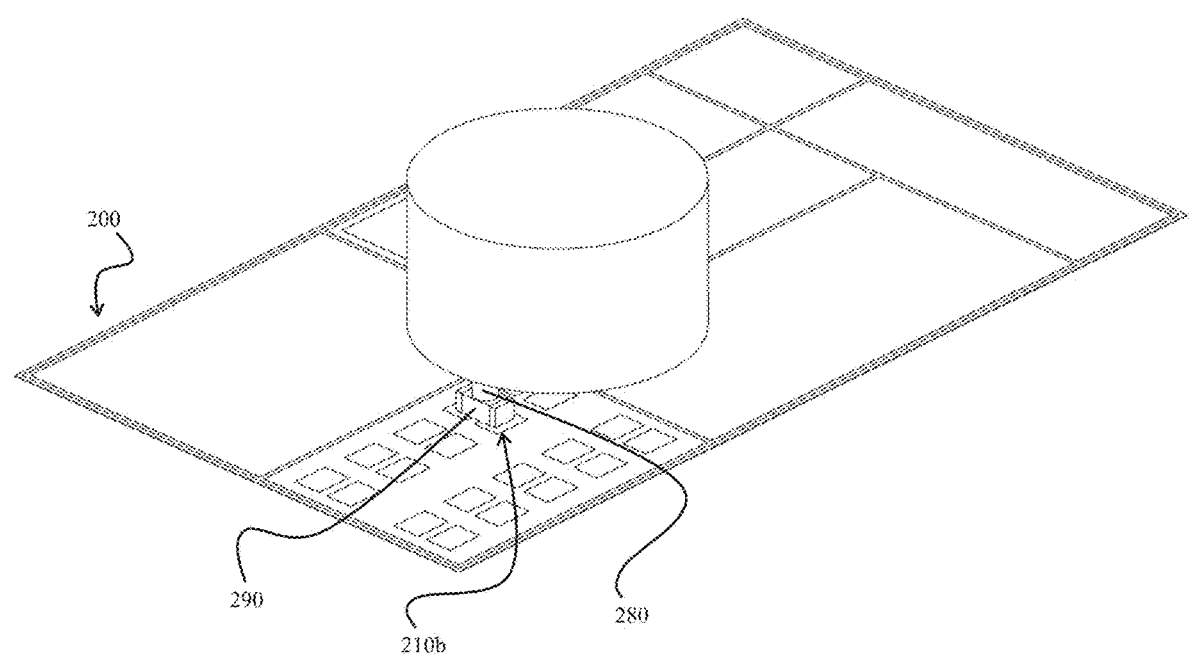
FIG. 5 shows an elevated angle view of an exemplary test-site board as described herein having ten test sites, and additionally showing a PnP vacuum nozzle holding a component that is touching a test site.
Figure 6:
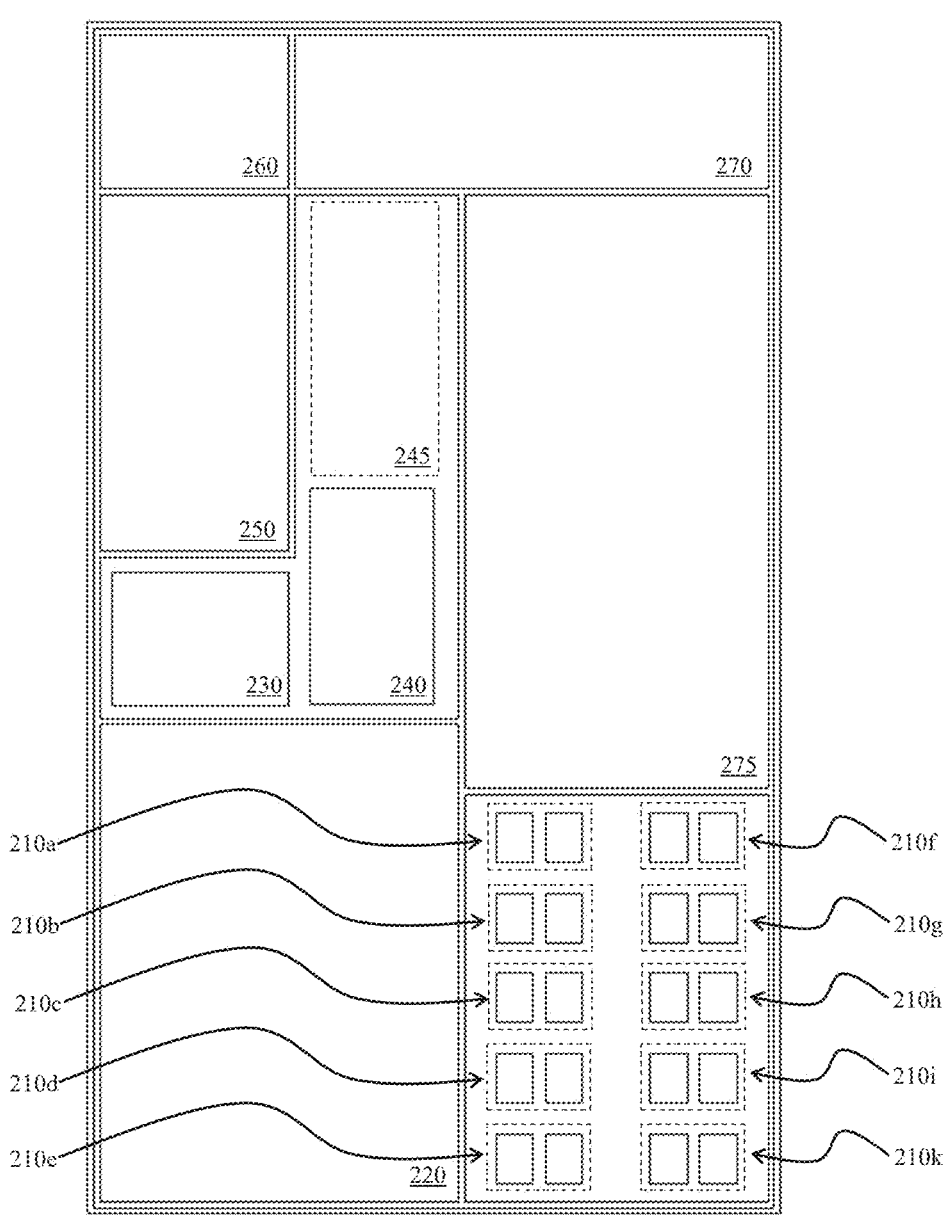
FIG. 6 shows a top-down view of an exemplary test-site board as described herein having ten test sites.

A system and method are disclosed for an improved electronics part verification system ("EPVS").

TABLE OF REFERENCE NUMBERS FROM DRAWINGS

The following table is for convenience only and should not be construed to supersede any potentially inconsistent disclosure herein.

| Reference Number | Description |
|---|---|
| 100 | test-site board |
| 110 | test site |
| 110a | test-site pad |
| 110b | test-site pad |
| 120 | LCR meter/multimeter |
| 130 | transmission chip |
| 140 | microprocessor |
| 145 | other electronic components |
| 150 | onboard comparator |
| 160 | storage chip |
| 170 | other IO components |
| 175 | display |
| 180 | PnP machine vacuum nozzle |
| 190 | Component |
| 190a | component terminal |
| 190b | component terminal |
| 195 | general purpose two-terminal probe/test site |
| 200 | test-site board |
| 210a-k | test sites |
| 220 | LCR meter/multimeter |
| 245 | other electronic components |
| 280 | PnP machine vacuum nozzle |
| 290 | component |
| 290a | component terminal |
| 290b | component terminal |
| 310 | test-site board |
| 320 | PnP machine |
| 330 | on-board LCR meter/multimeter |
| 340 | off-board LCR meter/multimeter |
| 350 | wire connecting LCR meter /multimeter to test-site board |
| 410 | test-site board |
| 420 | PnP machine |
| 430 | on-board LCR meter/multimeter |
| 440 | off-board LCR meter/multimeter |
| 450 | wire connecting LCR meter /multimeter to test-site board |
| 1300 | method flowchart |
| 1310 | method step |
| 1320 | method step |
| 1330 | method step |
| 1340 | method step |
| 1350 | method step |
| 1360 | method step |
| 1370 | method step |
| 1400 | method flowchart |
| 1410 | method step |
| 1420 | method step |
| 1430 | method step |
| 1440 | method step |
| 1450 | method step |
| 1460 | method step |
| 1600 | method flowchart |
| 1610 | method step |
| 1620 | method step |
| 1630 | method step |
| 1640 | method step |
| 1650 | method step |
| 1660 | method step |
| 1670 | method step |

5

-continued

| Reference Number | Description |
|---|---|
| 1680 | method step |
| 1700 | method flowchart |
| 1710 | method step |
| 1720 | method step |
| 1730 | method step |
| 1740 | method step |
| 1750 | method step |
| 1760 | method step |
| 1770 | method step |

An exemplary EPVS may comprise a universally retro-fittable test system and software for integration with a PnP machine. The system may include one or more test sites, an LCR meter/multimeter electrically (or non-electrically using non-electric-based technologies for transmitting signals, which may be currently available or which may become available) connected to the one or more test sites, supplemental components (processor, memory, communication technology, e.g., wireless communication such as Bluetooth and/or other wireless communication means and/or wired communication components) and software for running the EPVS, including but not limited to for communicating values measured with the LCR meter/multimeter to a user or other computer system and/or making decisions on how to proceed based on measured LCR value(s)

Mobile EPVS

In one embodiment the one or more test sites may be on a test-site board (e.g., printed circuit board assembly or "PCBA") configured to be loaded onto a PnP machine. The dimensions of an exemplary test-site board must be compatible with the PnP machine's specifications. In one exemplary embodiment, as shown in FIGS. 1-10, the dimensions of a test-site board may be approximately 12 inches×6 inches. These dimensions may be altered without departing from the scope of the disclosed invention. In general, dimensions of 12 inches by 6 inches for test-site board are within acceptable size restrictions/compatibility for most, if not all, currently available PnP machines.

FIGS. 1, 7-8, and 10 show a test-site board 100 having one test site 110. FIGS. 2-6 and 9 show a test-site board 200 having multiple test sites 210a-k.

A test-site board with multiple test sites may have several advantages. First, the conductive material on the pads for a test site may wear out over time, so having multiple test sites may allow for continued use of a board even after pad(s) on one or more test sites have worn away (or have become damaged, or are no longer functional, or may have deteriorated functionality). Instead of having to discard the test-site board, or repair/rehabilitate the test-site board, the system may simply use a different test site. This may result in cost savings and prevention of downtime.

Additionally, some PnP machines may not allow use of just one test site for multiple feeders. In this case multiple test sites may be needed for multiple feeders.

The test-site board may be loaded onto the PnP machine in the same or similar manner that a board for final assembly (i.e., for placing components on the board) is loaded onto the PnP machine. This embodiment—i.e., using a test-site board that is configured to be loaded onto a PnP machine in the same or similar manner that a board for final assembly is loaded onto a PnP machine—may be referred to as a "mobile" EPVS.

As shown in FIGS. 1, 7-8, and 10, a test-site board 100 may comprise one test site 110. FIGS. 2-6 and 9 show a test-site board that comprises ten test sites 210a-k. A test site may comprise two pads (e.g., pads 110a and 110b in FIGS. 1, 7-8, and 10), separated so that they are not electrically connected, for contacting the two terminals on the component A test site (e.g., test site 110 in FIGS. 1, 7-8, and 10) may be configured in different ways. The key features of a test site are (i) two electrically unconnected areas to be contacted by the two terminals of the component and (ii) the test site is configured so that the component will be placed at or on the test site from above. For the sake of simplicity, it may be advantageous for the test site to have no moving parts, e.g., as shown in FIGS. 1-10. In some embodiments, the test site may comprise moving parts, e.g., moving contact points that are brought into contact with the two component terminals from the side or bottom of the component or otherwise.

The two contact points of the test site (e.g., test site pad 110a and test site pad 110b in FIGS. 1, 7-8, and 10) may be electrically connected to the two terminals, respectively, of an LCR meter/multimeter. FIGS. 1, 7-8, and 10 show exemplary LCR meter/multimeter 120. FIGS. 2-6 and 9 show exemplary LCR meter/multimeter 220. In one embodiment, the LCR meter/multimeter may be integrated into the test-site board. FIGS. 1, 7-8, and 10 show an exemplary embodiment in which LCR meter/multimeter 120 is integrated onto test-site board 100. FIGS. 2-6 and 9 show an exemplary embodiment in which LCR meter/multimeter 220 is integrated onto test-site board 200.

FIGS. 1, 7-8, and 10 show an exemplary test-site board 100 comprising test site 100, LCR meter/multimeter 120, transmission chip (e.g., wireless Bluetooth) 130, microprocessor 140, onboard comparator 150, storage chip 160, and other IO components 170). It should be appreciated that the exemplary test-site boards in FIGS. 1-10 (test-site board 100 in FIGS. 1, 7-8, and 10; test-site board 200 in FIGS. 2-6 and 9) may comprise many different layouts and configurations of electrical and computer components within the scope of the disclosure herein.

Fixed EPVS

Figure 11:
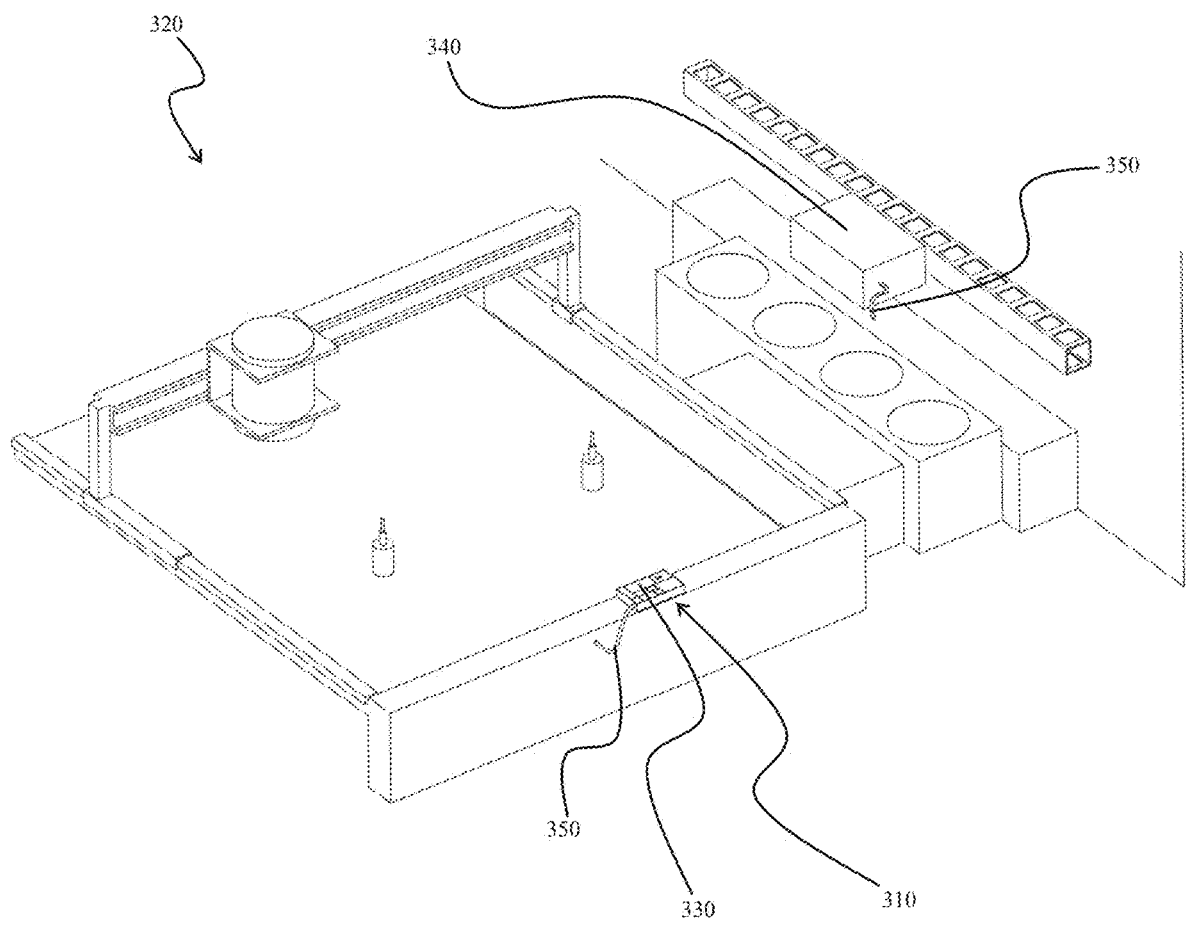
FIG. 11 shows an exemplary embodiment of a test-site board secured to a PnP machine as described herein.
Figure 12:
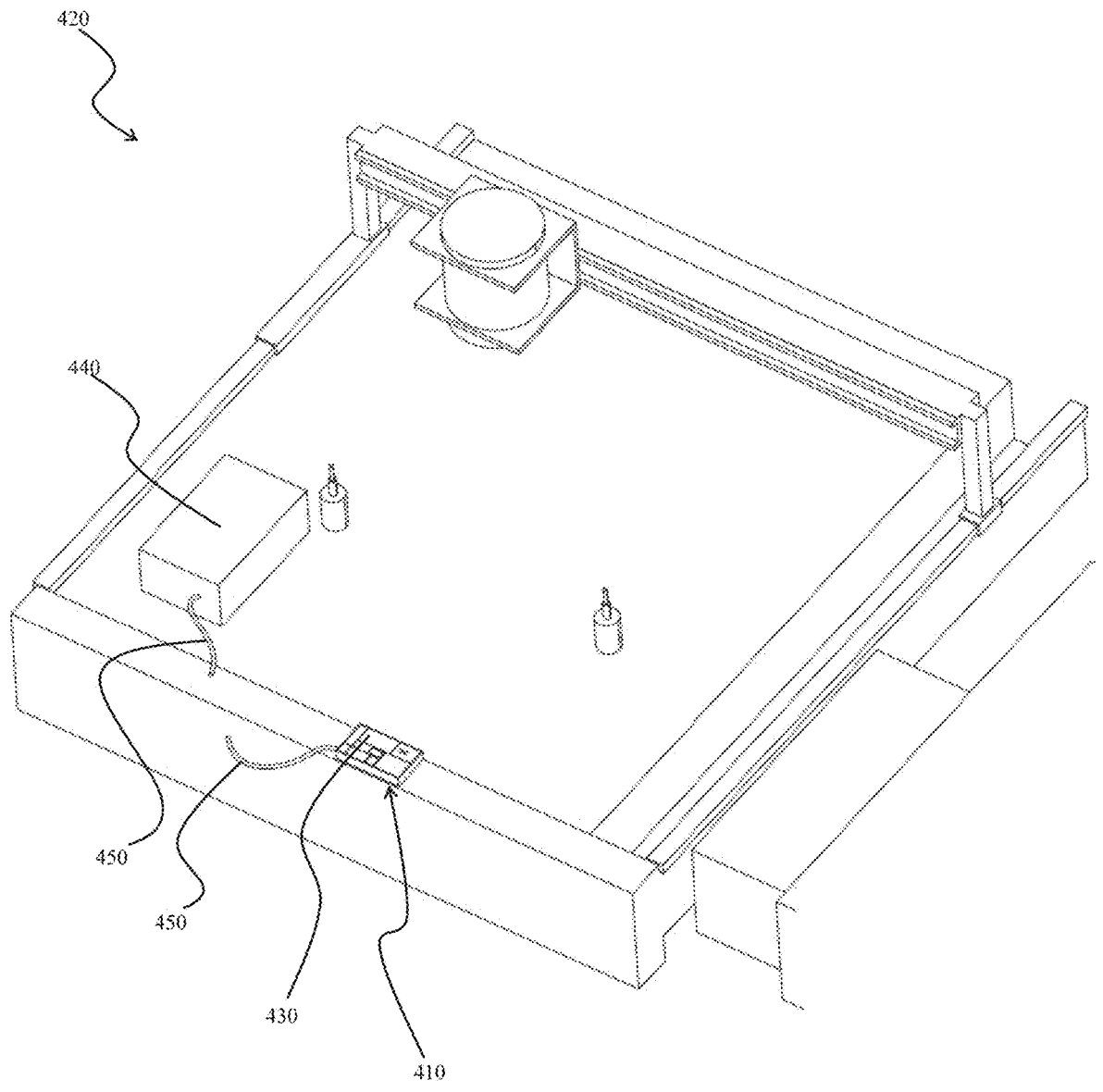
FIG. 12 shows an exemplary embodiment of a test-site board secured to a PnP machine as described herein.

In an alternative embodiment the one or more test sites may be on a test-site board that is secured (removably or non-removably) to the PnP machine. FIGS. 11 and 12 show exemplary embodiments in which a test-site board is secured to a PnP machine. FIG. 11 shows a test-site board 310 secured to PnP machine 320. FIG. 12 shows a test-site board 410 secured to PnP machine 420. Test-site boards 310 and 410 may be similar to test-site boards 100 and 200. FIGS. 11 and 12 are exemplary. In general, a test-site board as disclosed herein may be secured in many different ways to a PnP machine (or possibly—in some embodiments and depending on the PnP machine's capabilities and/or configuration—secured at a location fixed relative to a PnP machine, e.g., a shelf, wall, floor, or item secured to the PnP machine) and remain with the scope of the disclosure herein.

It is important for the test-site board to be secured in a known location relative to the PnP machine because, as explained herein below, the PnP machine uses its vacuum nozzle (or other pickup/retrieval feature) to place a component on one of the one or more test sites, which must therefore be within the reach of the PnP nozzle. In this embodiment, the test-site board may comprise mechanical features for securing the test-site board to the PnP machine or to, e.g., a rolling/moving apparatus for holding/securing the test-site board.

FIG. 11 shows a test-site board 310 secured to PnP machine 320. FIG. 11 does not show PnP machine 320's nozzle. The location to which test-site board 310 is secured on PnP machine 320 is within the spatial movement range of PnP machine 320's nozzle, so that PnP machine 320 may place a component on a test site on test-site board 310—similar to what is shown in FIGS. 1-5 and 10 for using a PnP machine's vacuum nozzle to place a component on a test site on a test-site board.

The LCR meter/multimeter may be integrated into the test-site board or otherwise connected to the one-or-more test sites on the test-site board. FIG. 11 shows a test-site board 310 that may have an integrated on-board LCR meter/multimeter 330. FIG. 11 also shows a possible embodiment for an off-board LCR meter/multimeter 340 that is connected to test-site board 310 via, e.g., wire 350. FIG. 12 shows a test-site board 410 that may have an integrated on-board LCR meter/multimeter 430. FIG. 12 also shows a possible embodiment for an off-board LCR meter/multimeter 440 that is connected to test-site board 410 via, e.g., wire 450.

The LCR meter/multimeter may be communicatively connected, either wired or wirelessly (e.g., Bluetooth and/or other wired or wireless communication technology), to a computer system for receiving LCR/multimeter values from the LCR meter/multimeter and processing, storing, and or taking action based on the received measured values.

In general, based on the measured values received from the LCR meter/multimeter, the software system may determine one of the following: (i) the tested component is the correct component; (ii) the tested component is not the correct component; or (iii) the tested component is the correct component but is oriented incorrectly.

In one embodiment, the test-site board may transmit measured LCR/multimeter values to OEM (for the PnP machine) software/hardware. In this embodiment the OEM software will perform the comparison and acceptance/rejection of the measured component.

In another embodiment of the concept, an external LCR meter/multimeter or OEM-produced LCR meter/multimeter may be connected to a test site via wires/cables and/or other wired or wireless technologies (including but not limited to non-electric-based technologies that are currently available or that may become available). The measured LCR/multimeter values may be received by the external OEM LCR meter/multimeter and then transmitted to the EPVS software/system or to the PnP OEM software for comparison and acceptance of the measured value. In this case, any independent, external OEM-produced LCR meter/multimeter can be used.

In general, after the LCR meter/multimeter measures values across the two terminals of the component, the component will be discarded. It is possible that the component could still be used, but the general practice in the industry has been to discard the component used for testing. The component may be discarded in many ways, including but not limited to: (i) using the PnP machine's vacuum nozzle (or other mechanism for grabbing, moving, and releasing components) to place the component in a discard location, e.g., a discard bin; (ii) using a wiper to brush/ "wipe" the component off the test site into a discard bin; and (iii) using a pneumatic "kicker" to blow/kick the component from the test site to a discard bin etc.

Manual Placement

In one embodiment, a test-site board as described herein may be used for manual placement of a component on the test site. In other words, instead of a PnP machine (or other automated machine or system) moving a component to a test site location and placing the component on the test site, a component may be manually placed on the test site, e.g., by a human holding/manipulating/moving the part directly in their hands or indirectly using a tool for holding/manipulating/moving the component. This may be useful for several reasons. For instance, in some circumstances when a feeder is reloaded during assembly, it may be necessary to manually place/press a component from the newly reloaded feeder onto the test site to verify the component.

EVPS hardware and/or software may be used for measurement, comparison, analysis, and recording of any two-point (and/or two-terminal) measurements (using an LCR meter/multimeter connected to or integrated with EVPS hardware/software). Alternatively, the EVPS system may be used as a pass-through instrument for recording, comparison, and analysis of measured values through a separate apparatus, instrument, or tool.

The EVPS system has the capability to connect a variety of measurement probes for any two-point measurements. The examples of these measurements include but not limited to the process of powering up of a new system; debugging of assembled products, cables, etc.; bench validation of measured values; functional testing etc. In all these cases, required values must be measured, compared, analyzed, and recorded. The EVPS hardware and software can be used independently or in conjunction with any other tools for this purpose.

The EVPS hardware may pass through the EVPS system for recording, comparison and analysis purposes.

Figure 7:
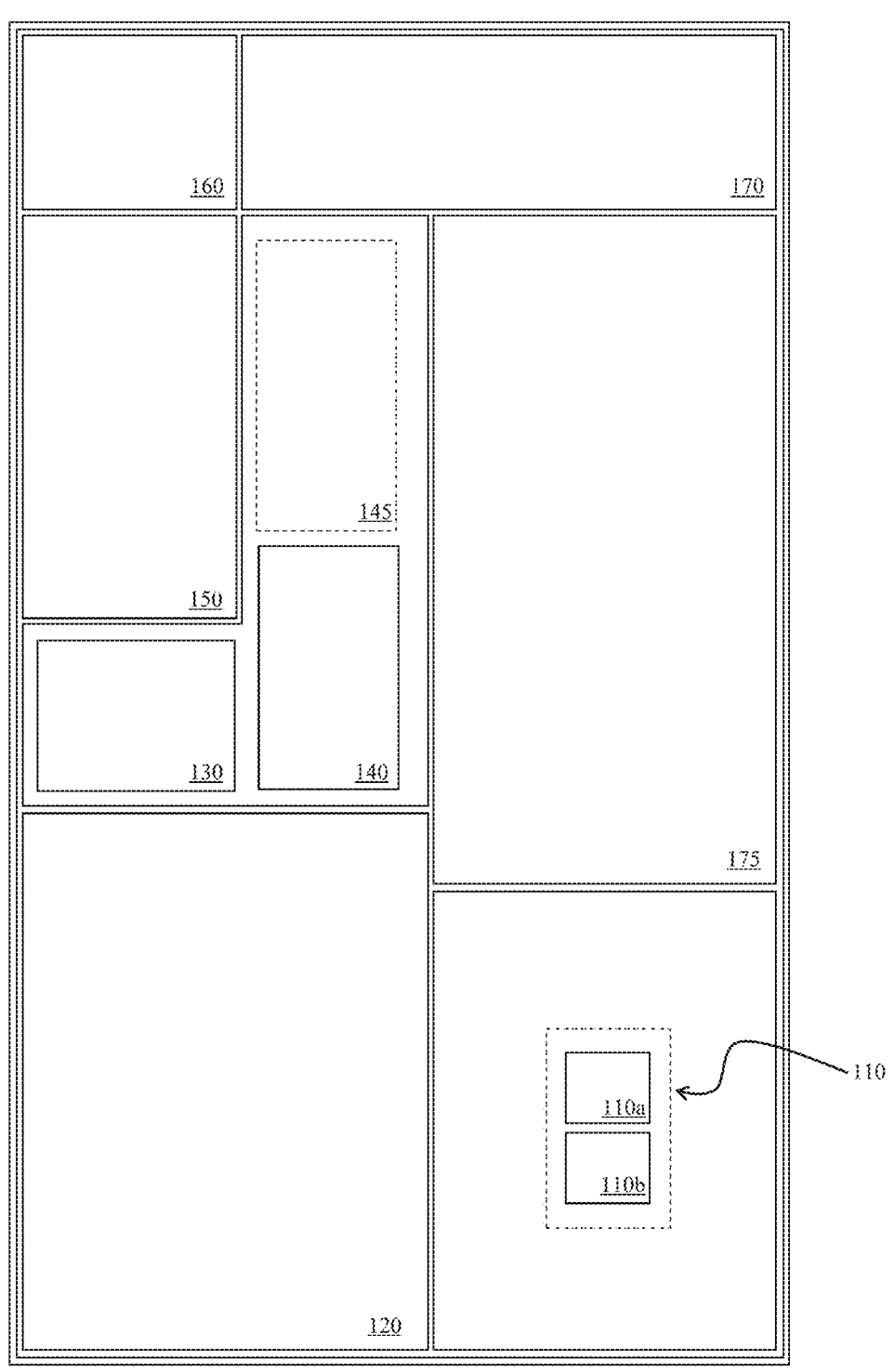
FIG. 7 shows a top-down view of an exemplary test-site board as described herein having one test site.
Figure 8:
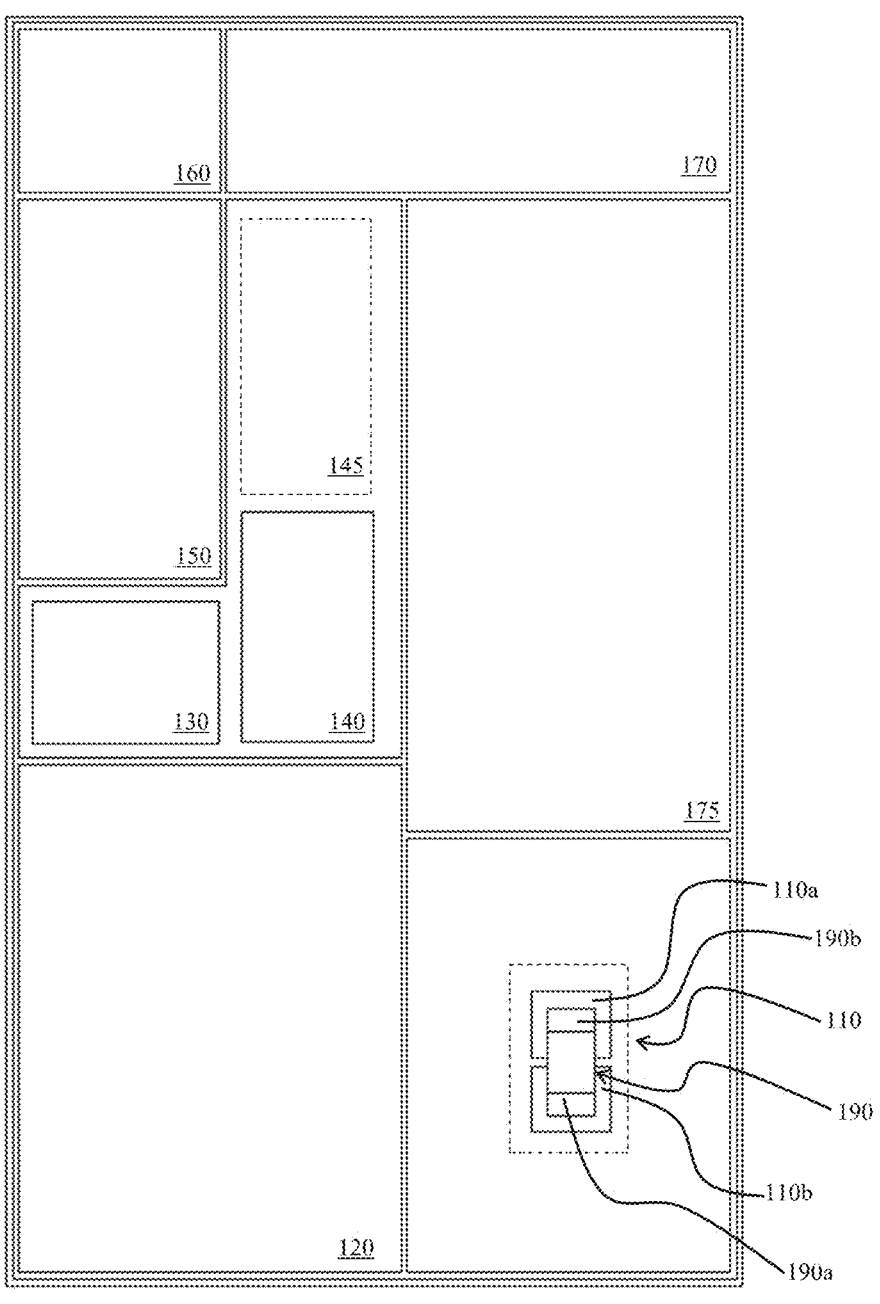
FIG. 8 shows a top-down view of an exemplary test-site board as described herein having one test site, and additionally showing a component that has been placed on and is touching the test site.
Figure 9:
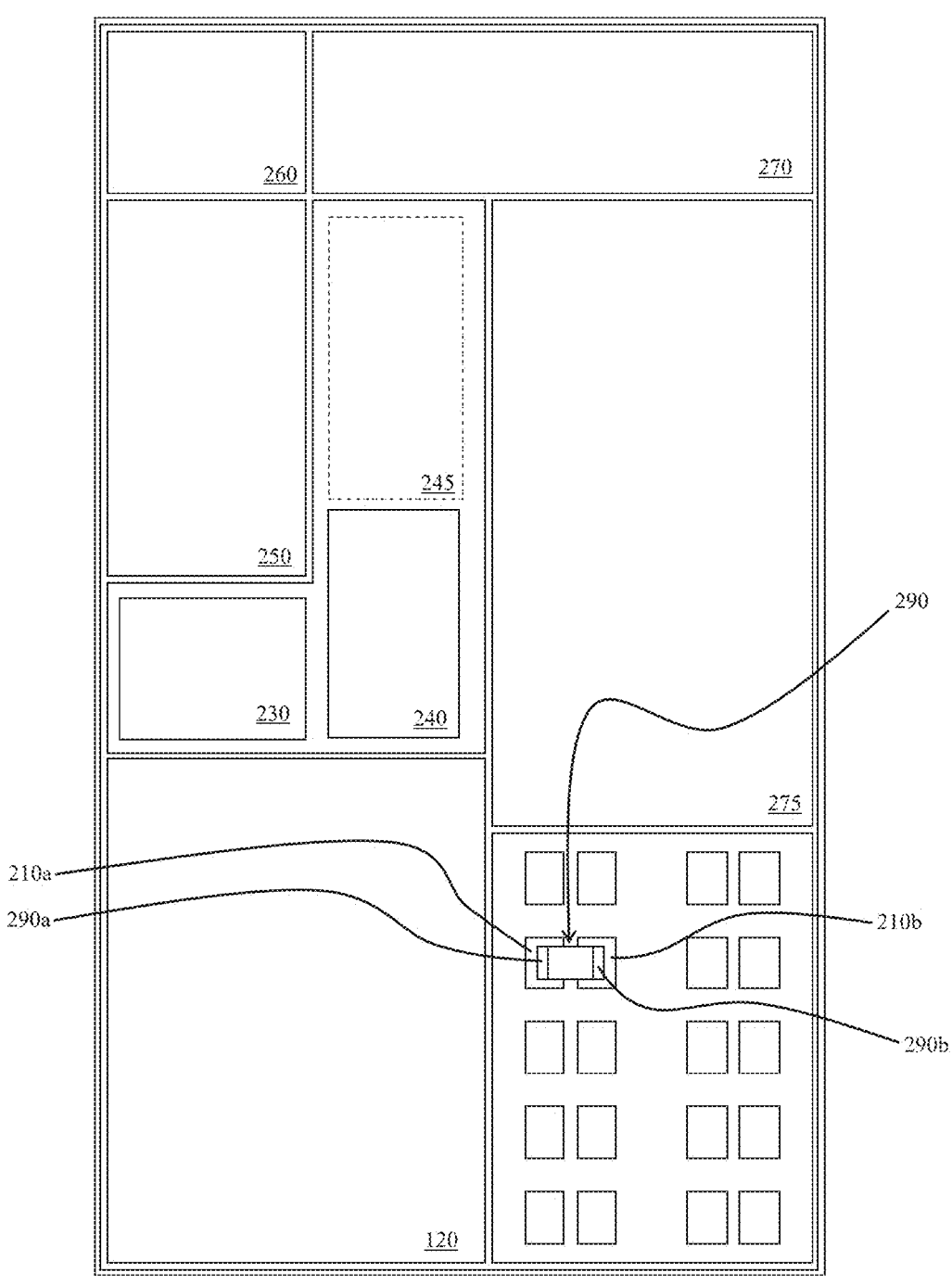
FIG. 9 shows a top-down view of an exemplary test-site board as described herein having ten test sites, and additionally showing a component that has been placed on and is touching one of the test sites.
Figure 10:
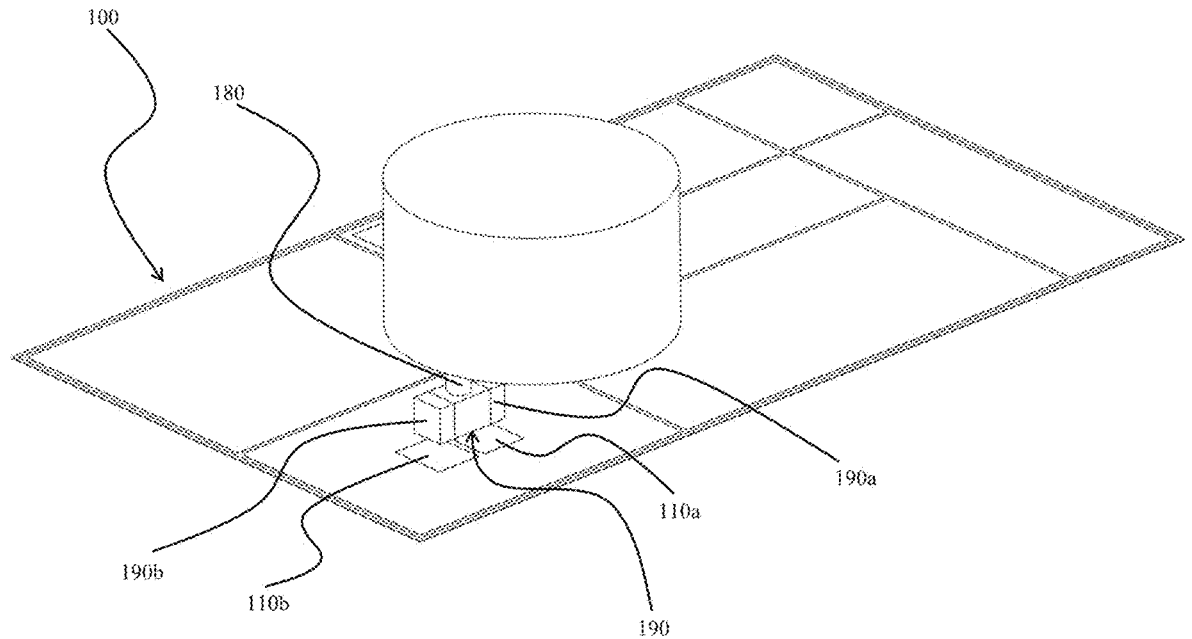
FIG. 10 shows an elevated angle view of an exemplary test-site board as described herein having one test site, and additionally showing a PnP vacuum nozzle holding a component above the test site.
Figure 15:
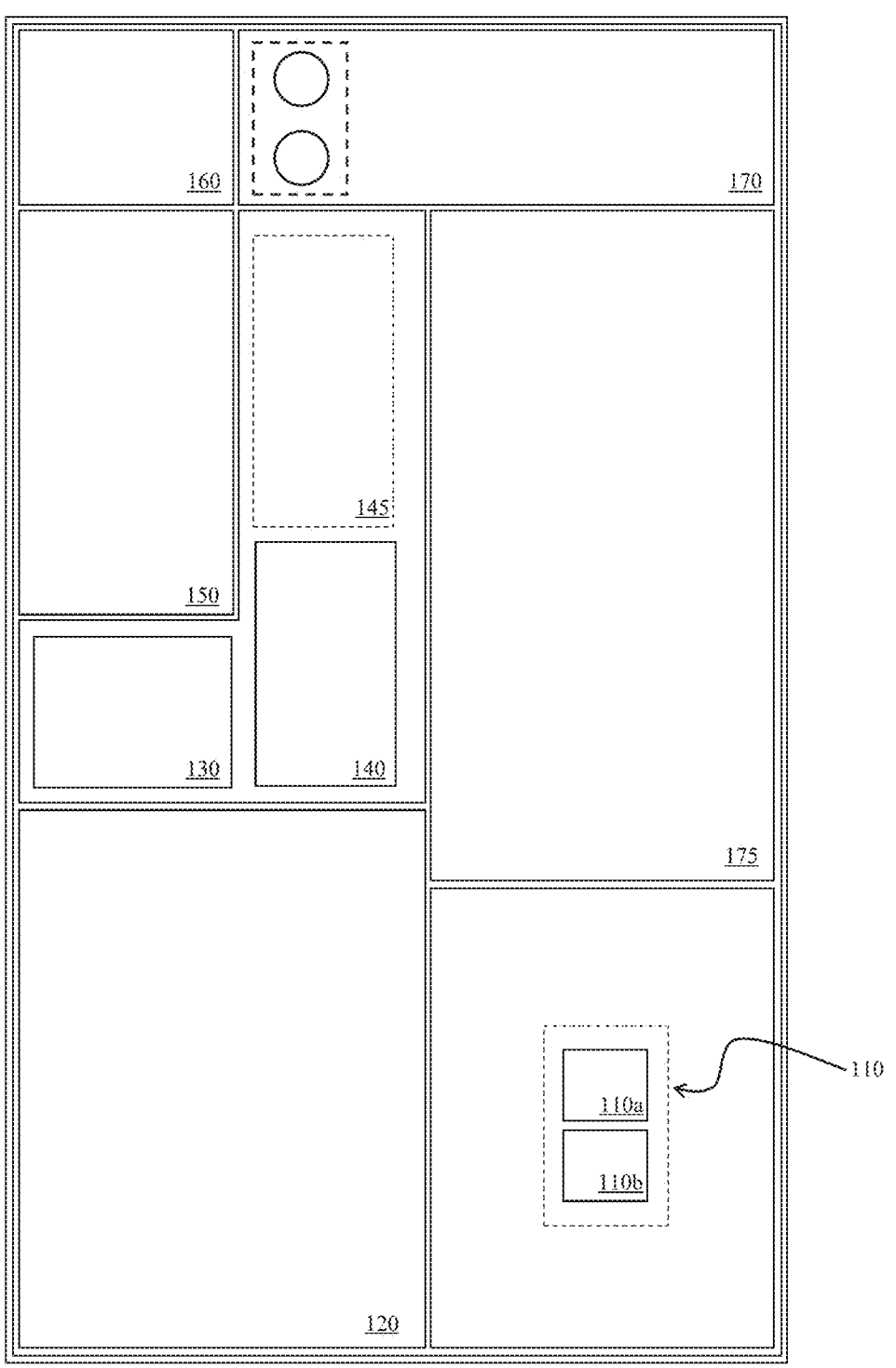
FIG. 15 shows a top-down view of an exemplary test-site board as described herein having one test site, and additionally having a site for manual probe/test sites.

FIG. 15 shows an exemplary test-site board similar to the test-site board shown in FIG. 7, except that the test-site board in FIG. 15 additionally includes a general purpose two-terminal probe/test site as described in this section in the preceding paragraphs. This is a probe/test site on the test-site board that could be used for reading values for any two-terminal test.

Any of the test sites described herein, including but not limited to manual and general purpose test sites, could be configured with manual leads, tweezers, etc. for convenience in obtaining two-terminal readings.

Additional Details

For the EPVS to function properly (specifically for the LCR meter/multimeter to function properly), the PnP machine vacuum nozzle must, in general, be made of a non-conductive material—or at least the portions of the PNP machine nozzle that come in contact with a component when the nozzle picks up and/or is holding/securing/moving a component must be made of a non-conductive material. This is because, for many components, the vacuum nozzle may be large enough relative to the component that the vacuum nozzle may contact both terminals when the vacuum nozzle is holding, moving, or otherwise manipulating the component (e.g., pressing or otherwise holding in place the component against the test-site pads).

The disclosed EPVS has at least the following benefits: (1) The EPVS is universal and can be outfitted/retrofitted/ used on any PnP machine; (2) The EPVS is significantly cheaper (likely at least an order of magnitude) than currently available technologies and solutions for automated component checking systems; and (3) The EPVS could be mobile/ modular such that it can be easily moved between PNP machines, allowing a company to have one EPVS for multiple PNP machines instead of a dedicated automated component verification system for each PNP machine.

Methods

Figure 13:
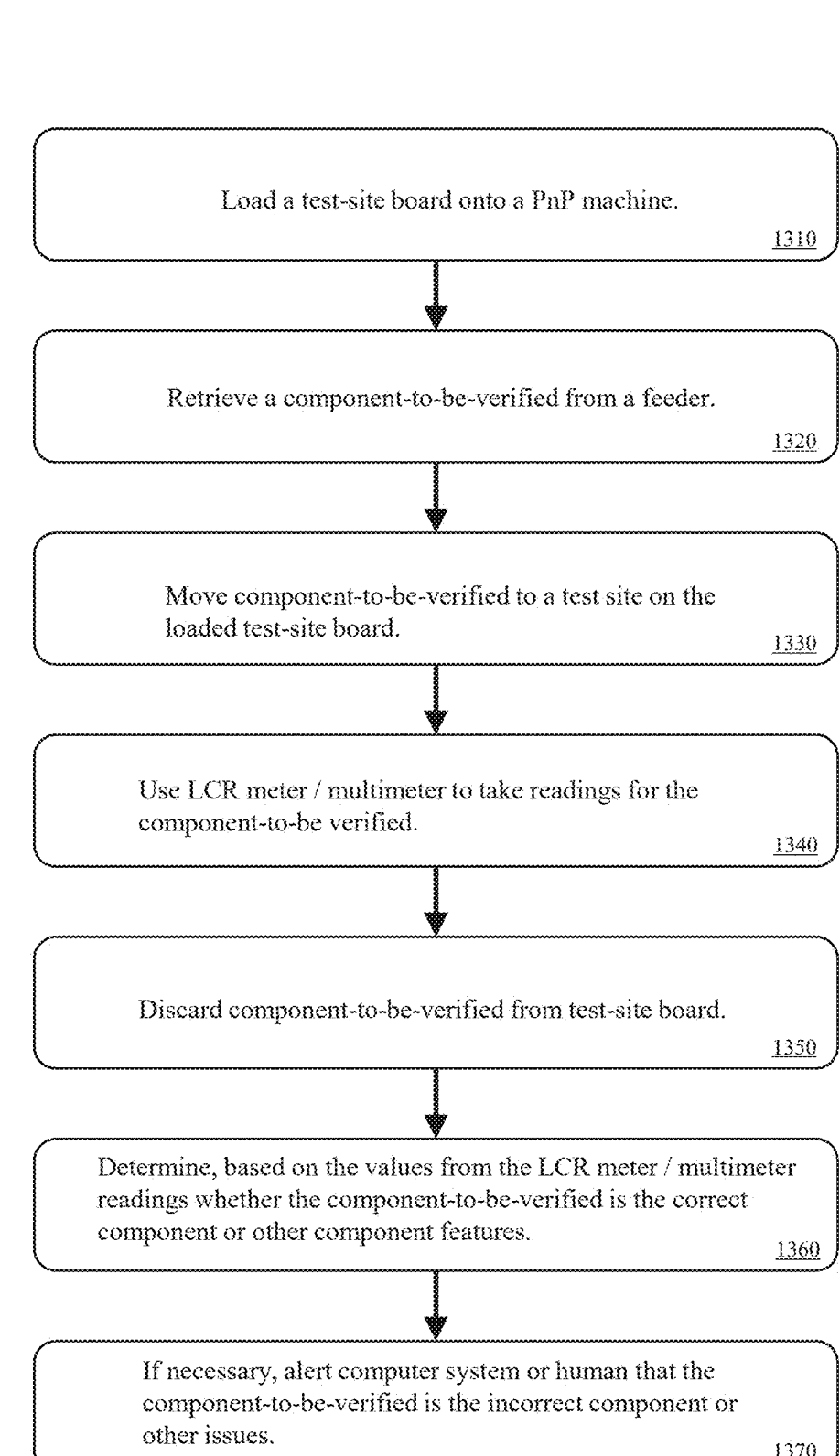
FIG. 13 shows a flowchart for an exemplary method for component verification as described herein.

A method for performing component verification in the context of electronics manufacturing/fabrication, especially in the context of attaching small components to a printed circuit board ("PCB") may comprise several steps, as shown in flowchart 1300 in FIG. 13.

At step 1310, a PnP machine may load a test-site board onto a PnP machine using the same machinery/mechanics that the PnP uses (or is configured to use) for loading a PCB for assembly including placement and attachment of components.

At step 1320, a PnP machine may retrieve a component-to-be-verified from a feeder or analogous apparatus. As described herein above, in one embodiment a PnP machine may use a vacuum nozzle to retrieve the component-to-be-tested.

At step 1330, the PnP machine may move the component-to-be-verified to a test site on the loaded test-site board, and may place the component-to-be-verified onto the test site such that a first terminal of the component-to-be-verified is touching a first pad of the test site, and a second terminal of the component-to-be-verified is touching a second pad of the test site.

At step 1340, the test-site board may use an LCR meter/multimeter to take readings for the component-to-be verified.

At step 1350, the component-to-be-verified may be discarded or otherwise removed from the test-site board.

At step 1360, a computing system may determine, based on the values from the LCR meter/multimeter readings, at least one from the following list: (i) whether the component-to-be-verified is the correct component; (ii) identification of the component-to-be-verified; and (iii) a characteristic or feature of the component-to-be-verified. This computing system may be referred to as an analysis module, and may be located in whole or in part on the test-site board, as part of the PnP machine, or as a connected standalone system.

At step 1370, based on the determination in step 1360, a computer system or human may be alerted that the component-to-be-verified is the incorrect component, is oriented incorrectly, and/or should be reviewed, replaced, modified, and/or adjusted for some other reason.

Another method for performing component verification in the context of electronics manufacturing/fabrication, especially in the context of attaching small components to a printed circuit board ("PCB") may comprise several steps, as shown in flowchart 1400 in FIG. 14.

At step 1410, a PnP machine may retrieve a component-to-be-verified from a feeder or analogous apparatus. As described herein above, in one embodiment a PnP machine may use a vacuum nozzle to retrieve the component-to-be-tested.

At step 1420, the PnP machine may move the component-to-be-verified to a test site on a test site-board that has been secured to the PnP machine, or to a location that is fixed relative to the PnP machine, and may place the component-to-be-verified onto the test site such that a first terminal of the component-to-be-verified is touching a first pad of the test site, and a second terminal of the component-to-be-verified is touching a second pad of the test site.

At step 1430, the test-site board may use an LCR meter/multimeter to take readings for the component-to-be verified.

At step 1440, the component-to-be-verified may be discarded or otherwise removed from the test-site board.

At step 1450, a computing system may determine, based on the values from the LCR meter/multimeter readings, at least one from the following list: (i) whether the component-to-be-verified is the correct component; (ii) identification of the component-to-be-verified; and (iii) a characteristic or feature of the component-to-be-verified.

At step 1460, based on the determination in step 1450, a computer system or human may be alerted that the component-to-be-verified is the incorrect component, is oriented incorrectly, and/or should be reviewed, replaced, modified, and/or adjusted for some other reason.

Another method for performing component verification in the context of electronics manufacturing/fabrication, especially in the context of attaching small components to a printed circuit board ("PCB") may comprise several steps, as shown in flowchart 1600 in FIG. 16.

At step 1610, a PnP machine may load a test-site board onto a PnP machine using the same machinery/mechanics that the PnP uses (or is configured to use) for loading a PCB for assembly including placement and attachment of components.

At step 1620, a PnP machine may retrieve a component-to-be-verified from a feeder or analogous apparatus. As described herein above, in one embodiment a PnP machine may use a vacuum nozzle to retrieve the component-to-be-tested.

At step 1630, the PnP machine may move the component-to-be-verified to a test site on the loaded test-site board, and may place the component-to-be-verified onto the test site such that a first terminal of the component-to-be-verified is touching a first pad of the test site, and a second terminal of the component-to-be-verified is touching a second pad of the test site.

At step 1640, the test-site board may use an LCR meter/multimeter to take readings for the component-to-be verified.

At step 1650, the component-to-be-verified may be discarded or otherwise removed from the test-site board.

At decision step 1660, a computing system may compare the value(s) from the LCR meter/multimeter readings to the specification value(s) (or polarity) for a target component to determine whether they match. This computing system may be referred to as an analysis module, and may be located in whole or in part on the test-site board, as part of the PnP machine, or as a connected standalone system.

At step 1670, if there is not a match a computer system or human may be alerted that the component-to-be-verified is the incorrect component, is oriented incorrectly, and/or should be reviewed, replaced, modified, and/or adjusted for some other reason.

At step 1680, if there is a match the PnP machine may proceed to use components from the same reel/source as the component-to-be-verified.

Another method for performing component verification in the context of electronics manufacturing/fabrication, especially in the context of attaching small components to a printed circuit board ("PCB") may comprise several steps, as shown in flowchart 1700 in FIG. 17.

At step 1710, a PnP machine may retrieve a component-to-be-verified from a feeder or analogous apparatus. As described herein above, in one embodiment a PnP machine may use a vacuum nozzle to retrieve the component-to-be-tested.

At step 1720, the PnP machine may move the component-to-be-verified to a test site on a test site-board that has been secured to the PnP machine, or to a location that is fixed relative to the PnP machine, and may place the component-to-be-verified onto the test site such that a first terminal of the component-to-be-verified is touching a first pad of the test site, and a second terminal of the component-to-be-verified is touching a second pad of the test site.

At step 1730, the test-site board may use an LCR meter/multimeter to take readings for the component-to-be verified.

At step 1740, the component-to-be-verified may be discarded or otherwise removed from the test-site board.

At decision step 1750, a computing system may compare the value(s) from the LCR meter/multimeter readings to the specification value(s) (or polarity) for a target component to determine whether they match.

At step 1760, if there is not a match a computer system or human may be alerted that the component-to-be-verified is the incorrect component, is oriented incorrectly, and/or should be reviewed, replaced, modified, and/or adjusted for some other reason.

At step 1770, if there is a match the PnP machine may proceed to use components from the same reel/source as the component-to-be-verified.

The steps in the above methods do not need to be necessarily performed in the order presented herein.

What is claimed is:

1. An apparatus, comprising:
a pick-and-place ("PnP") machine;
a printed circuit board ("test-site board") comprising a test site and an onboard LCR meter or multimeter connected to the test site, wherein the test-site board is dimensioned to be loaded onto the PnP machine and has been loaded onto the PnP machine;
computer-readable instructions stored on a non-transitory computer-readable storage medium ("PnP Instructions") that, when executed, cause the PnP machine to:
retrieve a two-terminal component-to-be-verified ("component"); and
move the component to the test site; and
non-transitory computer-readable instructions ("Analysis Instructions") that when executed cause an analysis module to:
retrieve from the onboard LCR meter or multimeter at least one value of the component;
determine, based on the at least one value read by the LCR meter or multimeter, at least one from the following list:
that the at least one value read by the LCR meter or multimeter matches a specification value of a target component;
that the at least one value read by the LCR meter or multimeter does not match a specification value of a target component;
that the at least one value read by the LCR meter or multimeter matches a specification polarity of a target component; and
that the at least one value read by the LCR meter or multimeter matches a specification polarity of a target component.

2. The apparatus of claim 1, wherein retrieving a component-to-be-verified comprises retrieving the component from a feeder for the PnP machine.

3. The apparatus of claim 1, wherein retrieving a component and moving the component to the test site comprises using a vacuum nozzle that is part of the PnP machine.

4. The apparatus of claim 1, wherein the onboard LCR meter or multimeter is an LCR meter.

5. The apparatus of claim 4, wherein the value retrieved from the onboard LCR meter is at least one from the following list: inductance, capacitance, and resistance.

6. The apparatus of claim 1, wherein the Analysis Instructions cause the analysis module to determine, based on the at least one value read by the LCR meter or multimeter, at least one from the following list:
that the at least one value read by the LCR meter or multimeter matches a specification value of a target component; and
that the at least one value read by the LCR meter or multimeter does not match a specification value of a target component.

7. An apparatus, comprising:
a pick-and-place ("PnP") machine;
a printed circuit board ("test-site board") comprising a test site, wherein the test-site board is secured to the PnP machine;
an LCR meter or multimeter connected to the test site;
computer-readable instructions stored on a non-transitory computer-readable storage medium ("PnP Instructions") that, when executed, cause the PnP machine to:
retrieve a two-terminal component-to-be-verified ("component"); and
move the component to the test site; and
non-transitory computer-readable instructions ("Analysis Instructions") that when executed cause an analysis module to:
retrieve from the LCR meter or multimeter at least one value of the component;
determine, based on the at least one value read by the LCR meter or multimeter, at least one from the following list:
that the at least one value retrieved from the LCR meter or multimeter matches a specification value of a target component;
that the at least one value retrieved from the LCR meter or multimeter does not match a specification value of a target component;
that the at least one value retrieved from the LCR meter or multimeter matches a specification polarity of a target component; and
that the at least one value retrieved from the LCR meter or multimeter does not match a specification polarity of a target component.

8. The apparatus of claim 7, wherein retrieving a component-to-be-verified comprises retrieving the component from a feeder for the PnP machine.

9. The apparatus of claim 7, wherein retrieving a component and moving the component to the test site comprises using a vacuum nozzle that is part of the PnP machine.

10. The apparatus of claim 7, wherein the LCR meter or multimeter is an LCR meter.

11. The apparatus of claim 10, wherein the value retrieved from the LCR meter is at least one from the following list: inductance, capacitance, and resistance.

12. The apparatus of claim 7, wherein the Analysis Instructions cause the analysis module to determine, based on the at least one value read by the LCR meter or multimeter, at least one from the following list:
that the at least one value retrieved from the LCR meter or multimeter matches a specification value of a target component; and
that the at least one value retrieved from the LCR meter or multimeter does not match a specification value of a target component.

13. The apparatus of claim 7, wherein the LCR meter or multimeter is on the test-site board.

13

14. A method, comprising:

retrieving, using a pick-and-place ("PnP") machine, a two-terminal component-to-be-verified ("component");

moving, using the PnP machine, the component to a test site on a test-site board, wherein the test-site board is at least one from the following list:

loaded onto the PnP machine using the same machinery or mechanics that the PnP is configured to use for loading a printed circuit board for assembly including placement and attachment of components;

secured to the PnP machine; and secured to a location that is fixed relative to the PnP machine;

using an LCR meter/multimeter to measure a value of the component;

determining, based on the at least one value measured for the component by the LCR meter or multimeter, at least one from the following list:

that the at least one value measured for the component by the LCR meter or multimeter matches a specification value of a target component;

that the at least one value measured for the component by the LCR meter or multimeter does not match a specification value of a target component;

that the at least one value measured for the component by the LCR meter or multimeter matches a specification polarity of a target component; and

that the at least one value measured for the component by the LCR meter or multimeter does not match a specification polarity of a target component.

15. The method of claim 14, wherein retrieving a component-to-be-verified comprises retrieving the component from a feeder for the PnP machine.

16. The method of claim 14, wherein retrieving a component and moving the component to the test site comprises using a vacuum nozzle that is part of the PnP machine.

17. The method of claim 14, wherein the LCR meter or multimeter is an LCR meter.

18. The method of claim 17, wherein the value retrieved from the LCR meter is at least one from the following list: inductance, capacitance, and resistance.

19. The method of claim 14, wherein the determining step comprises determining, based on the at least one value read by the LCR meter or multimeter, at least one from the following list:

that the at least one value measured for the component by the LCR meter or multimeter matches a specification polarity of a target component; and that the at least one value measured for the component by the LCR meter or multimeter does not match a specification polarity of a target component.

20. The method of claim 14, wherein the LCR meter or multimeter is on the test-site board.

* * * * *